(12) United States Patent
Carlson (10) Patent No.: US 6,396,305 B1
(45) Date of Patent: May 28, 2002

(54) DIGITAL LEAKAGE COMPENSATION CIRCUIT

(75) Inventor: Roy M. Carlson, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,191

(22) Filed: Mar. 29, 2001

(51) Int. Cl.[7] .............................................. H03K 19/096

(52) U.S. Cl. .............................. 326/98; 326/27; 326/93; 326/95; 326/121

(58) Field of Search ............................ 326/27, 28, 93, 326/95, 97, 98, 113, 121

(56) References Cited

U.S. PATENT DOCUMENTS

| | | | | |
|---|---|---|---|---|
| 6,046,606 A | * | 4/2000 | Chu et al. ................... | 326/112 |
| 6,060,910 A | * | 5/2000 | Inui ............................ | 326/112 |
| 6,163,173 A | * | 12/2000 | Storino et al. .............. | 326/121 |
| 6,255,853 B1 | * | 7/2001 | Houston ..................... | 326/121 |
| 6,292,029 B1 | * | 9/2001 | Kumar et al. ................ | 326/83 |
| 6,329,846 B1 | * | 12/2001 | Davies et al. ............... | 326/121 |

OTHER PUBLICATIONS

Ken'ichi Agawa et al; "A Bit–Line Leakage Compensation Scheme for Low–Voltage SRAM's;" Symposium on VLSI Circuits Digest of Technical Papers; 2000; Kawasaki, 212–8520, Japan.

* cited by examiner

Primary Examiner—Michael Tokar
Assistant Examiner—Steven S. Paik
(74) Attorney, Agent, or Firm—Blakely, Sokoloff, Taylor & Zafman LLP (57) ABSTRACT

A digital leakage compensation circuit for compensating for leakage in a dynamic circuit includes a dummy precharge circuit, a dummy input circuit, a dummy evaluation circuit, a dummy latching circuit, a sense circuit and a storage circuit. The dummy circuitry matches the size and layout of corresponding precharge, input, evaluation and latching circuitry in the dynamic circuit so that the leakage can be accurately modeled. The sense circuit senses the leakage and generates a signal, stored in the storage circuit, which causes an adjustable latching circuit to provide additional leakage compensation in the dynamic circuit. Alternatively, the dynamic circuit may include a driving circuit with an adjustable trip point. The sense circuit provides the signal to the driving circuit to adjust the trip point to compensate for the leakage.

30 Claims, 9 Drawing Sheets

DIGITAL LEAKAGE COMPENSATION CIRCUIT

TECHNICAL FIELD

This disclosure relates generally to dynamic logic circuits, and in particular but not exclusively, relates to leakage compensation circuits for use in dynamic logic circuits.

BACKGROUND

Dynamic logic circuits are clocked circuits typically used in high-speed applications such as, for example, microprocessors. Typical dynamic logic circuits have two main operating phases, a first (or precharge) phase and a second (or evaluation) phase, defined by the duty cycle of the clock signal. In the precharge phase, the clock signal is at its first phase logic level (e.g., a logic low level), which causes the dynamic circuit to precharge a node of the dynamic circuit to a predetermined voltage level (e.g., the supply voltage VDD). Then when the clock signal transitions to its second phase logic level (e.g., a logic high level), the dynamic circuit selectively discharges the node as a function of the logic state of an input data signal. When the input data signal does not cause the node to be discharged, the node ideally remains charged to the precharged level.

Further, during the evaluation phase, the dynamic circuit generates an output signal having a logic level that is a function of the logic level of the node. The logic level of the output signal is then latched at the end of the evaluation phase.

One shortcoming of such dynamic circuits is that charge may leak from the node. This charge leakage can cause a dynamic circuit to malfunction (e.g., latch the output signal with an incorrect logic level) when the logic level of the input data signal is supposed to cause the node to remain charged during the evaluation phase. In particular, the leakage can undesirably discharge the node to a level that the dynamic circuit detects as a change in logic level, thereby resulting in a circuit failure.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a system and method for compensating for leakage in a dynamic logic circuit are described herein. In the following description, numerous specific details are provided, such as implementations of various component circuits (e.g., sense, adjustable latching, storage circuit, and adjustable driving circuits), to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
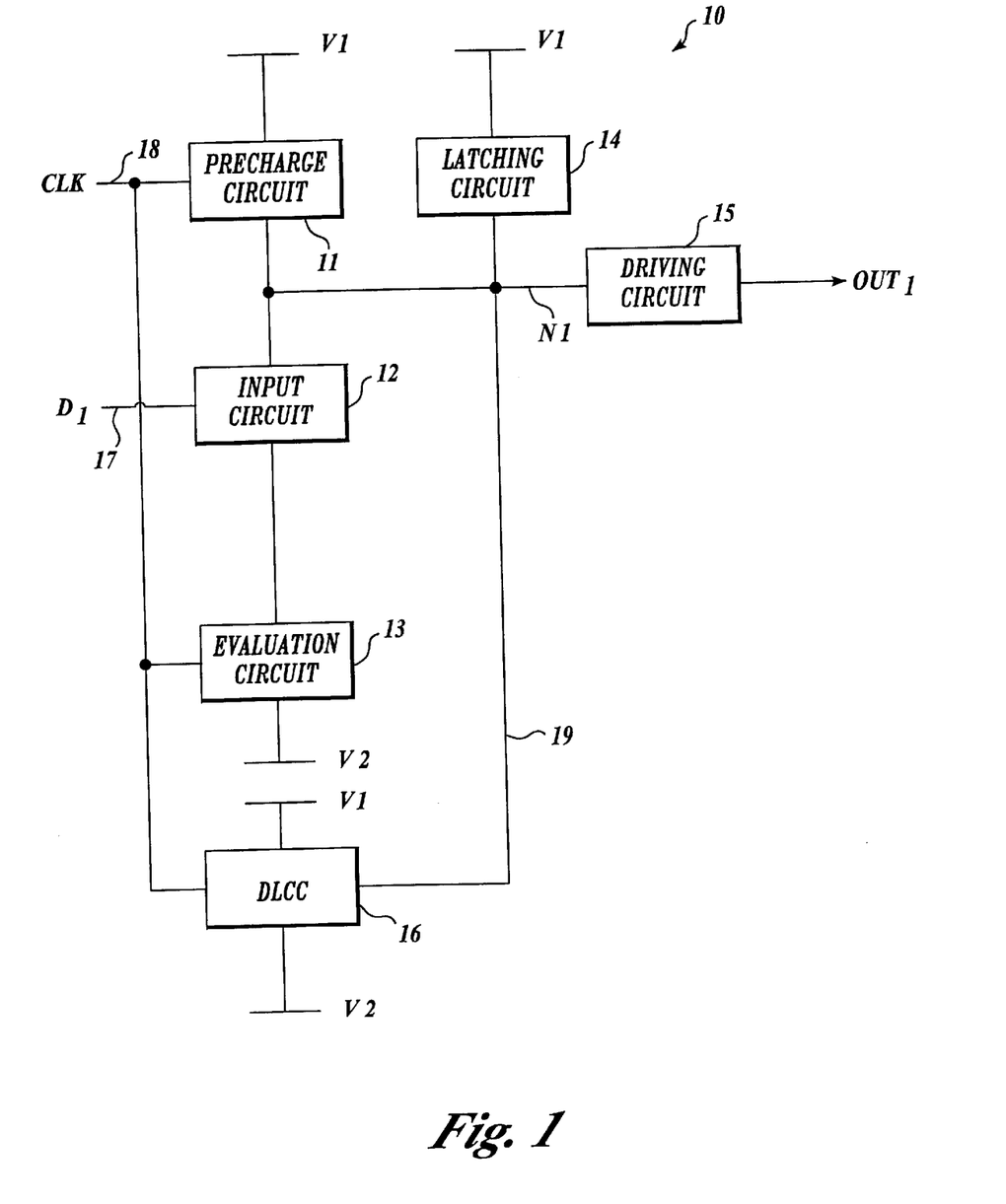
FIG. 1 is a block diagram illustrating a dynamic logic circuit with a digital leakage compensation circuit (DLCC), according to one embodiment of the present invention.

By way of background, dynamic logic circuit 10 is a dynamic circuit having a precharge phase and an evaluation phase. During every precharge phase, dynamic logic circuit 10 is designed to generate an output signal at a particular logic level. Then, during each evaluation phase, as a function of the logic level of an input data signal, dynamic logic circuit 10 causes the output signal to either remain at the same logic level or transition to another logic level.

FIG. 1 illustrates a dynamic logic circuit 10, according to one embodiment of the present invention. This embodiment of dynamic logic circuit 10 includes a precharge circuit 11, an input circuit 12, an evaluation circuit 13, a latching circuit 14, a driving circuit 15 and a digital leakage compensation circuit (DLCC) 16 (also referred to generally as a compensation circuit). In accordance with the present invention, DLCC 16 uses replicas of precharge circuit 11, input circuit 12, evaluation circuit 13 and latching circuit 14 to model leakage from a node between precharge circuit 11 and driving circuit 15. In particular, DLCC 16 models the leakage from this node during the evaluation phase when the input data signal is in a state that does not cause a transition of the output signal generated by dynamic logic circuit 10.

In one embodiment, DLCC 16 includes replicas of precharge circuit 11, input circuit 12, evaluation circuit 13 and latching circuit 14. In addition, DLCC 16 includes one or more latching circuits that can, in effect, be selectively enabled in parallel with latching circuit 14. Embodiments of DLCC 16 are described in more detail below, in conjunction with FIGS. 2–5.

Dynamic logic circuit 10 is connected to receive power from buses carrying voltages V1 and V2. Typically, the bus carrying voltage V1 is one of the power supply "rails" and the bus carrying voltage V2 is the other rail (e.g., VDD and ground rails). These buses are also referred to herein as the V1 and V2 buses.

The elements of this embodiment of dynamic logic circuit 10 are interconnected as follows. Input circuit 12 is connected to receive an input data signal $D_1$ via a line 17, to a node N1 and to evaluation circuit 13. Precharge circuit 11 is connected to the V1 bus, to node N1, and to a line 18 to receive a clock signal CLK. Evaluation circuit 13 is connected to the V2 bus, to input circuit 12 and to line 18. Latching circuit 14 is connected to the V1 bus and to node N1. Driving circuit 15 is connected to node N1 and generates the output signal $out_1$. Precharge circuit 11, input circuit 12, evaluation circuit 13, latching circuit 14 and driving circuit 15 form what is referred to herein as the core dynamic circuit.

DLCC 16 is also connected to line 18. In addition, DLCC 16 is connected to node N1 via a line 19. In an alternative embodiment, DLCC 16 can be connected to receive the complement of the clock signal CLK. In another alternative embodiment, DLCC 16 can be connected to a second clock signal (not shown) that causes DLCC 16 to complete its modeled evaluation phase before the evaluation phase begins for dynamic logic circuit 10.

This embodiment of dynamic logic circuit 10 operates as follows. Starting with clock signal CLK being at a first logic level, dynamic logic circuit 10 enters the precharge phase. In the precharge phase, precharge circuit 11 is enabled and evaluation circuit 13 is disabled, thereby allowing precharge circuit 11 to pull the voltage at node N1 to a level about equal to that of the V1 bus (i.e., the precharged level). Latching circuit 14 helps maintain the voltage at node N1 at the precharge level. In one embodiment, latching circuit 14 is implemented as a half latch, operating to pull the voltage at node N1 in the same direction as precharge circuit 11. Driving circuit 15 generates the output signal OUT, with a logic level as a function of the voltage level at node N1. Thus, in normal operation, output signal OUT, will have the same logic level during every precharge phase.

Then, when clock signal CLK transitions to a second logic level, dynamic logic circuit 10 enters the evaluation phase. In the evaluation phase, precharge circuit 11 is disabled and evaluation circuit 13 is enabled. Input circuit 12 is either enabled or disabled as a function of the logic level of input data signal $D_1$. When input circuit 12 is enabled, input circuit 12 and evaluation circuit 13 operate together to provide a current path between node N1 and the V2 bus. In this way, input circuit 12 and evaluation circuit 13 overcome the operation of latching circuit 14 to pull the voltage at node N1 to a level about equal to that of the V2 bus. In response to the change in voltage level at node N1, driving circuit 15 causes the logic level of output signal OUT, to transition.

In contrast, when input data signal $D_1$ disables input circuit 12, evaluation circuit 13 does not alter the voltage level at node N1 as when input circuit 12 is enabled. Latching circuit 14, ideally, maintains the voltage level at node N1 at about the precharge level. However, because latching circuit 14 must be weak enough to be overcome by input circuit 12 and evaluation circuit 13 during the evaluation phase, latching circuit 14 may not be able to fully compensate for charge leakage from node N1.

In this embodiment, latching circuit 14 is designed to be as weak as possible to help maximize the speed at which input circuit 12 and evaluation circuit 13 can pull down the voltage level at node N1. Stated another way, the stronger latching circuit 14 is in maintaining the voltage at node N1 at the V1 level, the more time it takes input circuit 12 and evaluation circuit 13 to pull the voltage to the V2 level. Thus, in conventional dynamic circuits, the strength of the corresponding latching circuit is typically selected as a tradeoff between speed and leakage compensation. However, unlike such conventional dynamic circuits, in this embodiment of the present invention, latching circuit 14 is designed to be as small as possible (i.e., only strong enough to compensate for the minimum expected leakage from node N1, plus noise). If the leakage exceeds the level for which latching circuit 14 can compensate, DLCC 16 operates to provide added compensation as described below.

As previously mentioned, DLCC 16 models the performance of precharge circuit 11, input circuit 12, evaluation circuit 13 and latching circuit 14 during the evaluation phase with the input data signal being in a state that does not cause a transition of the output signal generated by dynamic logic circuit 10. In particular, DLCC 16 models the voltage level (and leakage) at node N1 during the evaluation phase with input circuit 12 being disabled. However, in this embodiment, DLCC 16 performs this modeling while dynamic logic circuit 10 is in the precharge phase. This allows DLCC 16 to compensate for leakage from node N1 before the evaluation phase begins (i.e., before the core dynamic circuit starts responding to the logic level of input data signal $D_1$).

DLCC 16 senses the change in voltage level at node N1D caused by the leakage and, in response, enables one or more latching circuits that are connected between the V1 bus and node N1. The latching circuits or circuits remain enabled at least for the duration of the next evaluation phase. The enabled latching circuit or circuits, in effect, combine with latching circuit 14 to more strongly pull the voltage at node N1 to the voltage level of the V1 bus. However, the enabled latching circuit or circuits are designed so that they will not prevent input and evaluation circuits 12 and 13 from pulling the voltage of node N1 toward that of the V2 bus when the logic level of input data signal D1 enables input circuit 12. In this way, DLCC 16 compensates for charge leakage that cannot be fully compensated for by latching circuit 14 alone. This operation of DLCC 16 does tend to reduce the speed of dynamic logic circuit 10. However, the resulting speed may be acceptable for lower-speed applications. Thus, unlike conventional circuits that cannot be adjusted when the leakage is too high (and thus, discarded), a part incorporating dynamic logic circuit 10 may be adjusted to prevent leakage-induced circuit failures. The part is therefore still functional for use in lower-speed applications.

Figure 2:
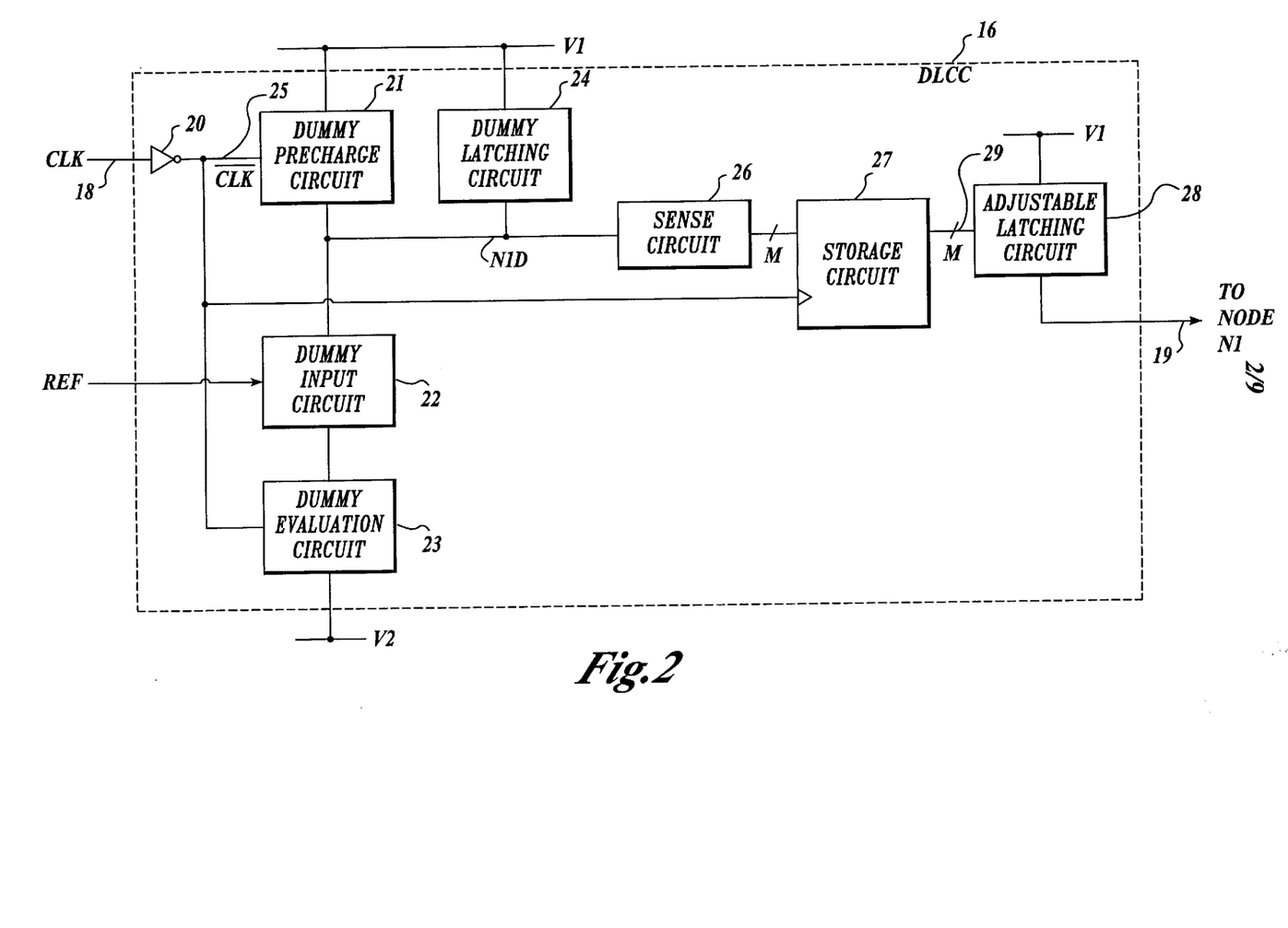
FIG. 2 is a more detailed block diagram illustrating a DLCC, according to one embodiment of the present invention.

FIG. 2 illustrates DLCC 16, according to one embodiment of the present invention. In this embodiment, DLCC 16 includes an inverter 20, a dummy precharge circuit 21, a dummy input circuit 22, a dummy evaluation circuit 23, and a dummy latching circuit 24. In addition, DLCC 16 includes a sense circuit 26, a storage circuit 27 and an adjustable latching circuit 28. In one embodiment, dummy precharge circuit 21, dummy input circuit 22, dummy evaluation circuit 23 and dummy latching circuit 24 are designed to be identical to precharge circuit 11, input circuit 12, evaluation circuit 13 and latching circuit 14 of the core dynamic circuit (see FIG. 1). In addition, sense circuit 26 can be designed to match the loading of driving circuit 15 (FIG. 1). More generally, the characteristics of nodes N1 and N1D, especially the sizes and layout topology of the elements connected to these nodes can be matched as closely as possible to accurately model layout effects and gate and channel leakage. In this way, DLCC 16 is able to accurately model the charge leakage from node N1 in the core dynamic circuit. Adjustable latching circuit 28 includes one or more selectively enabled latching circuits that are connected between the V1 bus and line 19 (i.e., which is connected to node N1 in the core dynamic circuit as shown in FIG. 1).

In an alternative embodiment, dummy precharge circuit 21, dummy input circuit 22, dummy evaluation circuit 23 and dummy latching circuit 24 are designed to be proportional or scaled replicas of precharge circuit 11, input circuit 12, evaluation circuit 13 and latching circuit 14 of the core dynamic circuit (see FIG. 1). In addition, sense circuit 16 is scaled with respect to the gate loading of driving circuit 15 (FIG. 1) to scale gate leakage. This embodiment reduces the size of DLLC 16, but because all of the circuits are scaled by the same factor, DLLC 16 can be expected to accurately model the charge leakage from node N1.

The elements of this embodiment of DLCC 16 are interconnected as follows. An input lead of inverter 20 is connected to line 18 to receive clock signal CLK. Dummy input circuit 22 is connected to receive a reference signal REF having a logic level corresponding to that of input data signal D, when node N1 in the core dynamic circuit is to remain precharged during the evaluation phase. Dummy input circuit 22 is also connected to a node N1D and to dummy evaluation circuit 23. Dummy precharge circuit 21 is connected to the V1 bus, to node N1D, and to a line 25, which is connected to an output lead of inverter 20, to receive the complement of clock signal CLK. Dummy evaluation circuit 23 is connected to the V2 bus and to line 25. Dummy latching circuit 24 is connected to the V1 bus and to node N1D.

An input lead of sense circuit 26 is connected to node N1D. In this embodiment, sense circuit 26 outputs an M-bit sense signal to data terminals of storage circuit 27, where M represents an integer greater than or equal to one. A clock terminal of storage circuit 27 is connected to the output lead of inverter 20. Storage circuit 27 outputs an M-bit signal to adjustable latching circuit 28, which is connected to the V1 bus and, via line 19, to node N1 in the core dynamic circuit (FIG. 1).

This embodiment of DLCC 16 operates as follows. Inverter 20 generates the complement of clock signal CLK. As a result, DLCC 16, in effect, has "dummy" precharge and evaluation phases that are about 1800° out of phase with the evaluation and precharge phases of dynamic logic circuit 10 (FIG. 1). This timing allows DLCC 16 to accurately model the leakage and configure adjustable latching circuit 28 during the precharge phase of dynamic logic circuit 10. As a result, during the following evaluation phase of dynamic logic circuit 10, DLCC 16 can help compensate for leakage from node N1 if input data signal D, disables input circuit 12

During the precharge phase of DLCC 16 (i.e., the dummy precharge phase), dummy precharge circuit 21 is enabled while reference signal REF keeps dummy input circuit 22 disabled. Thus, dummy precharge circuit 21 is able to pull the voltage level at node N1D toward that of the V1 bus (i.e., the precharged level). Dummy latching circuit 24 helps maintain the voltage level of node N1D at the precharged level. Sense circuit 26 monitors the voltage level of node N1D and, as a function of the voltage level, outputs an M-bit signal to the data terminals of storage circuit 27. In another embodiment, storage circuit 27 is implemented with an edgetriggered circuit so that the value of the M-bit signal is not stored in storage circuit 27 until clock signal CLK transitions to indicate the beginning of an evaluation phase of dynamic logic circuit 10 (FIG. 1).

At the start of the evaluation phase of the DLCC 16 (i.e., the dummy evaluation phase), storage circuit 27 stores the value of the M-bit signal provided by sense circuit 26 and thereby provides the same value of the M-bit signal to adjustable latching circuit 28. As a function of the value of the M-bit signal, adjustable latching circuit 28 selectively enables one or more of its latching circuits that are connected between the V1 bus and node N1. Each enabled latching circuit in adjustable latching circuit 28, in effect, augments the strength of latching circuit 14 (FIG. 1) in the core dynamic circuit. Using commercially available simulation tools, various ranges of voltage at node N1D can be mapped to a combination of latching circuits in adjustable latching circuit 28 that, when enabled, appropriately compensate for leakage from node N1 in the core dynamic circuit.

In one embodiment, sense circuit 26 maps a specified voltage range of node N1D into M settings using a relatively simple thermometer-coding scheme. In another embodiment, sense circuit 26 maps a specified voltage range of node N1D into $2^M$ smaller ranges that can be represented by its M-bit signal. Each value of the M-bit signal is mapped to the appropriate combination of latching circuits in adjustable latching circuit 28. For example, in one embodiment, adjustable latching circuit 28 has M latching circuits the sizes of which are binarily weighted. Sense circuit 26 generates the M-bit signal to have a binary value that is proportional to the difference between the voltage level of node N1D and that of the V1 bus. Each bit of the M-bit signal is associated with the corresponding binarily weighted latching circuit in adjustable latching circuit 28. Each bit, when set, enables its associated latching circuit.

Figure 3:
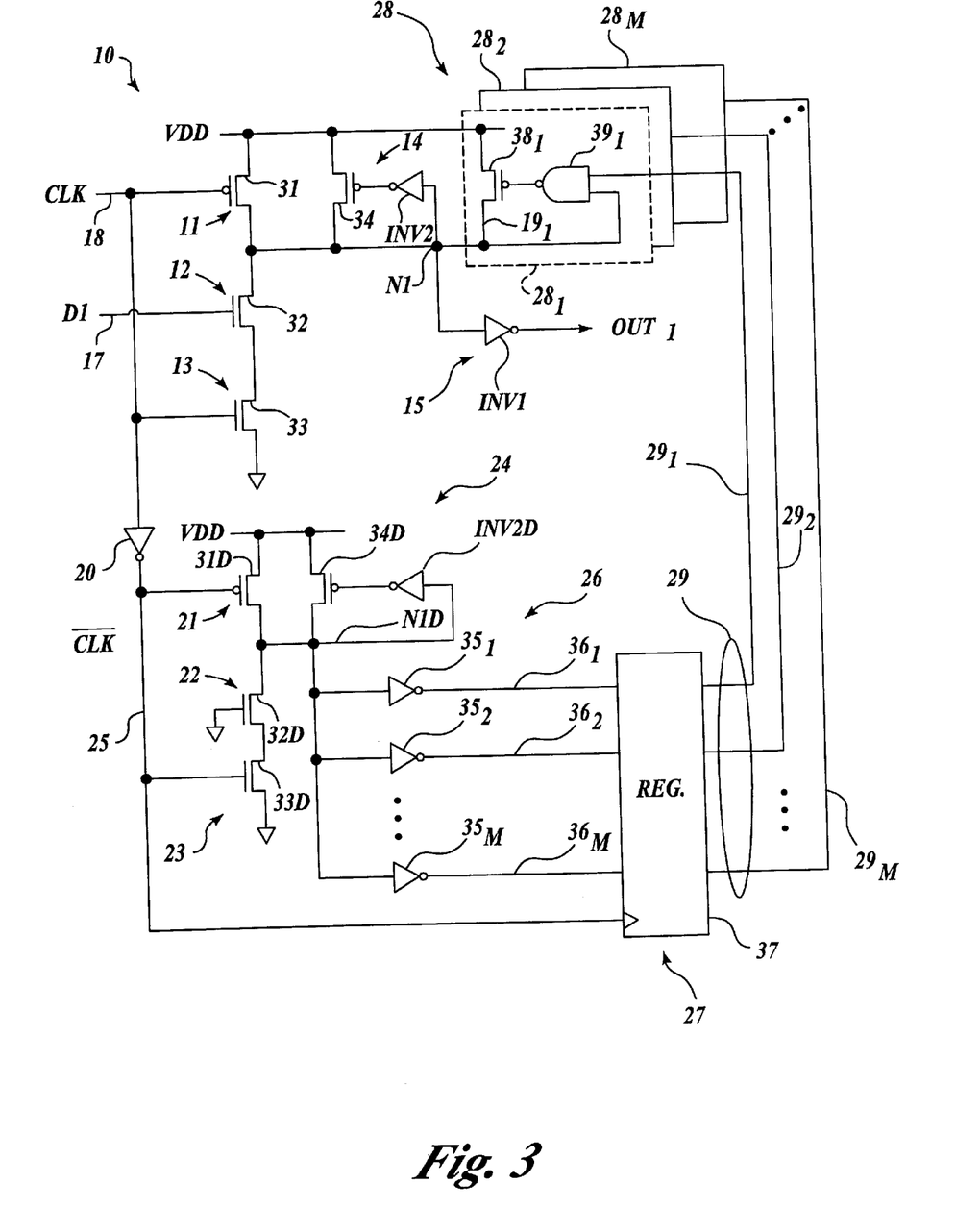
FIG. 3 is a circuit diagram illustrating a dynamic logic circuit with DLCC, according to one embodiment of the present invention.

FIG. 3 illustrates another embodiment of dynamic logic circuit 10. In this embodiment, the core dynamic circuit of dynamic logic circuit 10 is implemented as follows. Precharge circuit 11 is implemented with a P-channel transistor 31; input circuit 12 and evaluation circuit 13 are implemented with N-channel transistors 32 and 33, respectively; latching circuit 14 is implemented with a P-channel transistor 34 and an inverter INV2; and driving circuit 15 is implemented with an inverter INV1. P-channel transistor 34 is designed to be relatively weak in driving capability so that N-channel transistors 32 and 33 can quickly pull down the voltage level at node N1 during the evaluation phase.

Although input circuit 12 is implemented with a single N-channel transistor in the above embodiment, in other embodiments input circuit 12 can be implemented using different circuitry providing other logic functions. For example, input circuit 12 may be implemented with a register file having multiple parallel NAND stacks connected to node N1 and to receive additional different input signals.

This embodiment of DLCC 16 is implemented as follows. Dummy precharge circuit 21 is implemented with a P-channel transistor 31 D; dummy input circuit 22 and dummy evaluation circuit 23 are implemented with N-channel transistors 32D and 33D, respectively; dummy latching circuit 24 is implemented with a P-channel transistor 34D and an inverter INV2D; sense circuit 26 is implemented with inverters $35_1$–$35_M$ having output leads $36_1$–$36_M$, respectively; storage circuit 27 is implemented with a register 37; and adjustable latching circuit 28 is implemented with component circuits $28_1$–$28_M$. Component circuit 28, includes a P-channel transistor 38, and a two-input NAND gate $39_1$. Although not shown in FIG. 3, component circuit $28_2$ includes P-channel transistor $38_2$ and two-input NAND gate $39_2$ and so on with component circuit $28_M$ including P-channel transistor $38_M$ and two-input NAND gate $39_M$. In this embodiment, P-channel transistors $38_1$–$38_M$ are designed to have the same size. In other embodiments, the sizes of P-channel transistors $38_1$–$38_M$ may be different. In a further refinement, these P-channel transistors $38_1$–$38_M$ are sized so that when all of them are turned on, N-channel transistors 32 and 33 can still pull down the voltage at node N1 if they are turned on during an evaluation phase.

The elements of this embodiment of dynamic logic circuit 10 are interconnected as follows. P-channel transistor 31 has its source, gate and drain respectively connected to a VDD bus, line 18 (to receive clock signal CLK) and node N1. N-channel transistor 32 has its source, gate and drain respectively connected to the drain of N-channel transistor 33, line 17 (to receive input data signal $D_1$) and node N1. N-channel transistor 33 has its source and gate respectively connected to a ground bus and line 18 (to receive clock signal CLK). P-channel transistor 34 has its source, gate and drain connected to the VDD bus, the output lead of inverter INV2, and node N1, respectively. The input lead of inverters INV1 and INV2 are connected to node N1.

Transistors 31D–34D, node N1D and inverter INV2D are ideally interconnected in the same manner as the interconnection described above for transistors 31–33, node N1 and inverter INV2, except that line 25 replaces line 18 and the gate of N-channel transistor 32D is connected to the ground bus instead of line 17. As a result, during the dummy evaluation phase, the voltage level at node N1D effectively models the voltage at node N1 when input data signal D1 is at a logic low level (turning off N-channel transistor 32) during the evaluation phase of the core dynamic circuit. In addition, the total gate loading on node N1D and the layout of transistors 31D–34D and inverter INV2D match that of node N1 and of transistors 31–34 and inverter INV2 in the core dynamic circuit. Thus, the leakage at node N1D should accurately match the leakage at node N1 in the core dynamic circuit.

Further, inverters $35_1$–$35_M$ have their input and output leads respectively connected to node N1D and register 37. Register 37 has a clock terminal connected to line 25. The output leads of register 37 are connected to adjustable latching circuit 28 via line 29, which in this embodiment is made up of component lines $29_1$–$29_M$. In particular, component line $29_1$ is connected to one input lead of two-input NAND gate $39_1$ of component circuit $28_1$. Similarly, component lines $29_2$–$29_M$ are respectively connected to an input lead of two-input NAND gates $39_2$–$39_M$ (not shown). The other input leads of two-input NAND gates $39_1$–$39_M$ are connected to node N1 in the core dynamic circuit. The output leads of two-input NAND gates $39_1$–$39_M$ are respectively connected to the gates of P-channel transistors $38_1$–$38_M$, which in turn have their sources and drains respectively connected to the VDD bus and node N1.

In operation, inverter INV1, register 37, latching circuits 14 and 24 (implemented with transistor 34 and inverter INV2, and with transistor 34D and inverter INV2D, respectively) and transistors 31–33 and 31D–33D function as described above for elements 11–15 (FIG. 1) and elements 21–24 and 27 (FIG. 2). The operation of sense circuit 26 and adjustable latching circuit 28 are described in more detail below.

In this embodiment, inverters $35_1$–$35_M$ of sense circuit 26 are skewed so as to have different trip points. For example, inverters $35_1$–$35_M$ can be designed to have trip points of VDD-ΔV, VDD-2ΔV, ..., VDD-MΔV, respectively. These trip points are designed to enable one or more latching circuits in adjustable latching circuit 28 to provide leakage compensation to node N1 that varies depending on the magnitude of the leakage-induced voltage drop on node N1D.

In this embodiment, each inverter of sense circuit 26 is associated with a corresponding component latching circuit of adjustable latching circuit 28. Thus, when the leakage at node N1D is low, the voltage drop may be so low so that none of the inverters of sense circuit 25 will transition. This result indicates that latching circuit 14 will adequately compensate for the leakage at node N1. Thus, in this case, inverters $35_1$–$35_M$ output logic low signals to register 37, which are then stored at the end of the dummy evaluation phase. These logic low signals are provided to NAND gates $39_1$–$39_M$ of latching circuit 28, which then output logic high signals to P-channel transistors $38_1$–$39_M$. Consequently, P-channel transistors $38_1$–$38_M$ are turned off, thereby avoiding unnecessary augmentation of latching circuit 14.

However, a larger leakage at node N1D can cause a voltage drop to a level that is below the trip point of one or more inverters of sense circuit 26. For every inverter that "trips", a logic high signal is propagated to and stored in register 37 at the end of the dummy evaluation phase. These logic high values are propagated to the corresponding two-input NAND gates of adjustable latching circuit 28, thereby causing these NAND gates to operate as inverters with respect to the voltage level at node N1 in the core dynamic circuit. The inverter(s) that are not tripped continue to output logic low signal(s) that turn off the P-channel transistor(s) in the corresponding component latching circuit of latching circuit 28.

In addition to compensating for a relatively large range of leakage, a further advantage of this embodiment is that the compensation is updated every cycle. This feature advantageously allows dynamic logic circuit 10 to adjust for changes in leakage that can result over time and environmental conditions (e.g., temperature, power supply variations, etc.). In other embodiments, DLCC 16 can be clocked with a clock signal with a lower frequency than clock signal CLK (or include a divider circuit) so that register 37 is updated at a slower rate. This type of embodiment may be advantageously used to reduce power dissipation.

Figure 4:
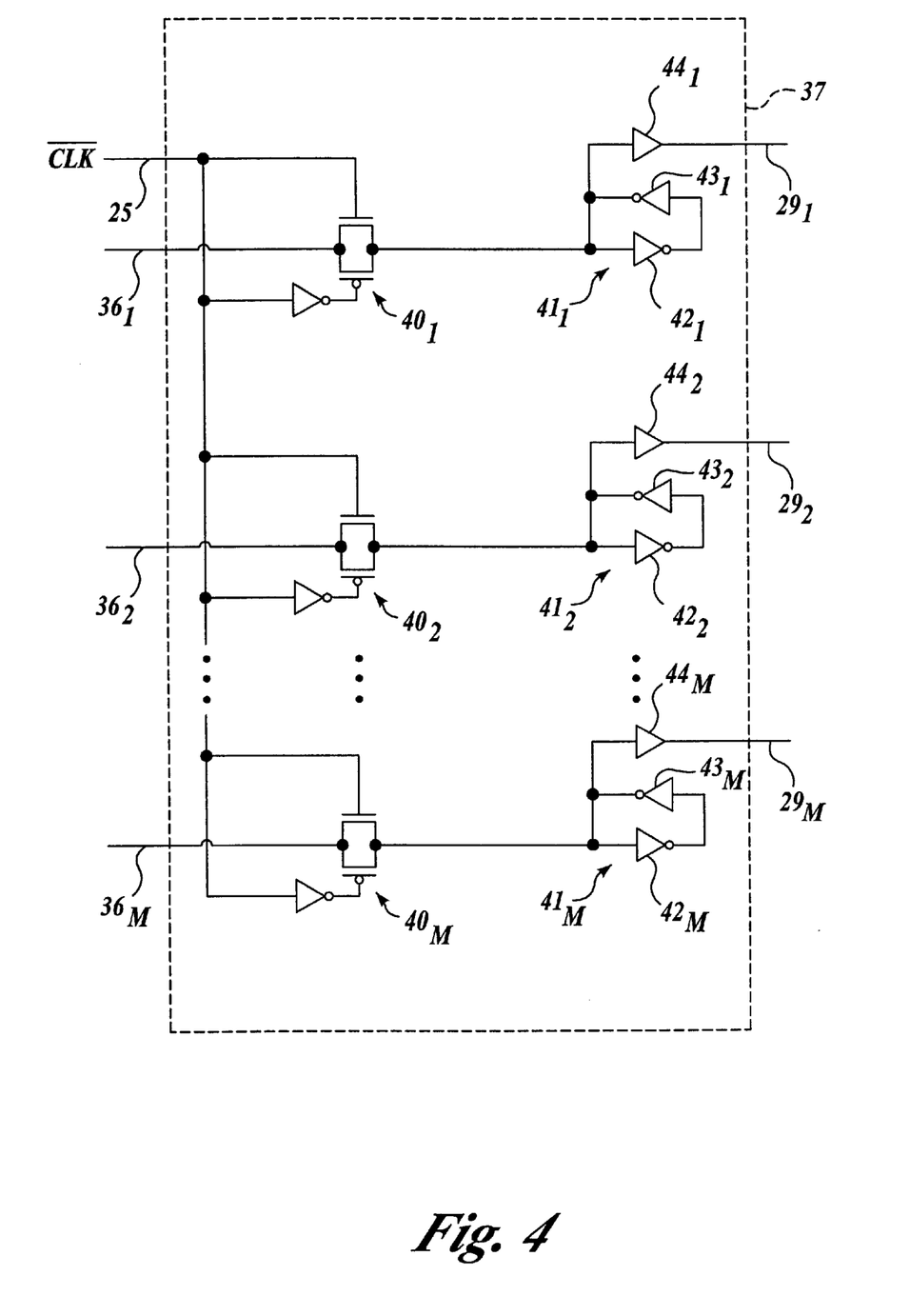
FIG. 4 is a circuit diagram illustrating the register depicted in FIG. 3, according to one embodiment of the present invention.

FIG. 4 illustrates an implementation of register 37 (FIG. 3), according to one embodiment of the present invention. This embodiment includes standard transmission gates $40_1$–$40_M$ and full-latch circuits $41_1$–$41_M$. Transmission gates $40_1$–$40_M$ have input terminals connected to lines $36_1$–$36_M$, respectively. Transmission gates $40_1$–$40_M$ are clocked by the complement of clock signal CLK received via line 25. Full-latch circuit $41_1$ includes inverters $42_1$ and $43_1$ connected in an "input-to-output" (i.e., latch) configuration and a non-inverting buffer $44_1$ connected to the output terminal of transmission gate $40_1$. Similarly, full-latch circuits $41_2$–$41_M$ include corresponding inverters $42_2$–$42_M$ and $43_2$–$43_M$ and noninverting buffers $44_2$–$44_M$, connected in the same manner. When the complement of clock signal CLK is at a logic high level (during the dummy evaluation phase), transmission gates $40_1$–$40_M$ are turned on. Thus, the signals on lines $36_1$–$36_M$ propagate to full-latch circuits $41_1$–$41_M$, which then outputs signals with equivalent logic levels on lines $29_1$–$29_M$. When the complement of clock signal CLK transitions to a logic low level (for the evaluation phase of the core dynamic circuit), transmission gates $40_1$–$40_M$ are turned off, thereby allowing full-latch circuits $41_1$–$41_M$ to store the current logic values of signals present on lines $36_1$–$36_M$. Although a particular implementation of register 37 is described above, register 37 may be implemented differently in other embodiments.

Figure 5:
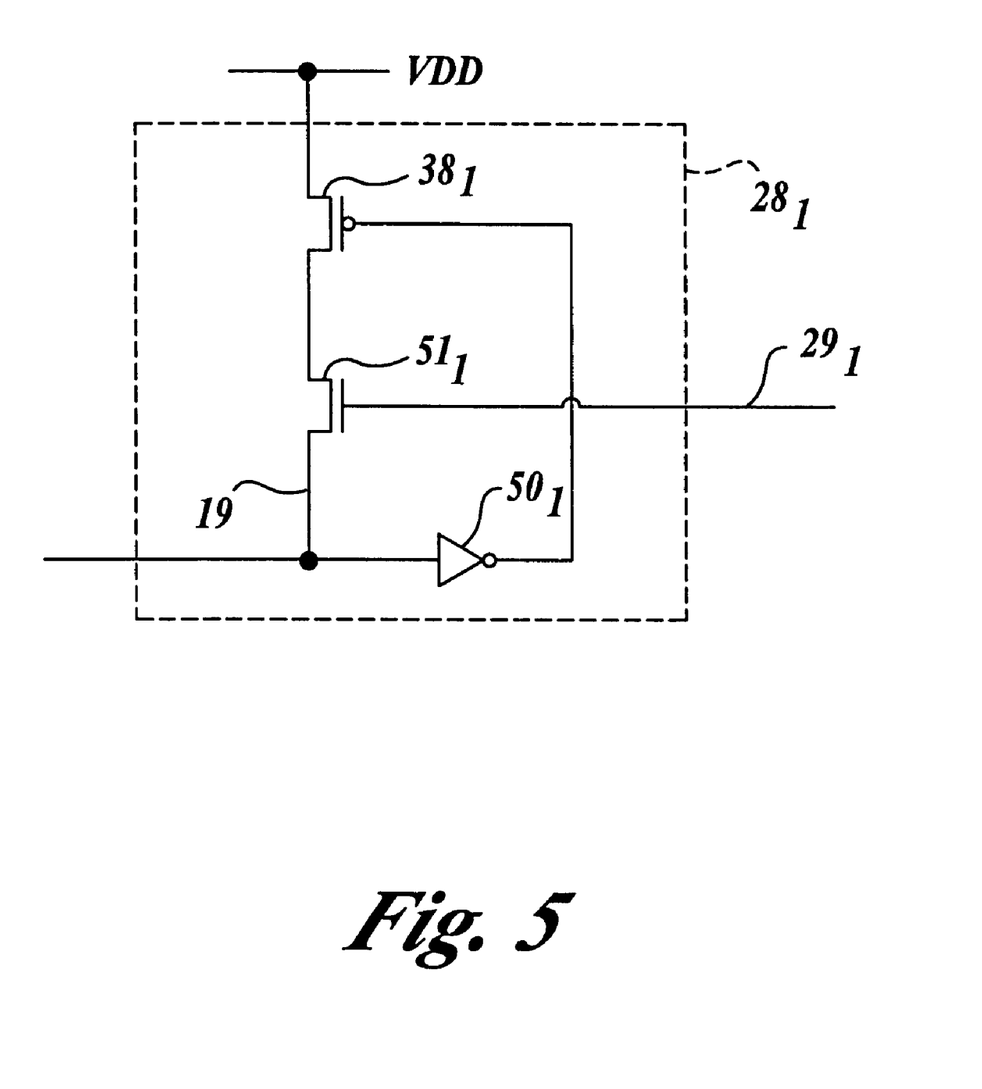
FIG. 5 is a circuit diagram illustrating a portion of an adjustable latching circuit, according to an alternative embodiment of the present invention.

FIG. 5 illustrates an alternative implementation of component latching circuit $28_1$ of adjustable latching circuit 28

(see FIG. 3), according to the present invention. In this alternative embodiment, NAND gate $39_1$ (FIG. 3) is deleted. Instead, an inverter $50_1$ and an N-channel transistor $51_1$ are used. In particular, inverter $50_1$ has its input lead connected to node N1 and its output lead connected to the gate of P-channel transistor $38_1$. N-channel transistor $51_1$ is connected in series between P-channel transistor $38_1$ and node N1, the gate of N-channel transistor $51_1$ being connected to line $29_1$.

In operation, when the signal on line $29_1$ is at a logic low level, N-channel transistor $51_1$ is turned off. Consequently, N-channel transistor $51_1$ breaks the current path between P-channel transistor $38_1$ and node N1, thereby preventing component latching circuit $28_1$ from augmenting latching circuit 14 (FIG. 3). Conversely, when the signal on line $29_1$ is at a logic high level, N-channel transistor $51_1$ does provide a current path between P-channel transistor $38_1$ and node N1. Component latching circuit $28_1$ will then function like latching circuit 14 (FIG. 3), with inverter 50, corresponding to inverter INV2 and transistors $38_1$ and $51_1$ (which is turned on) forming a "composite" transistor corresponding to P-channel transistor 34.

Figure 6:
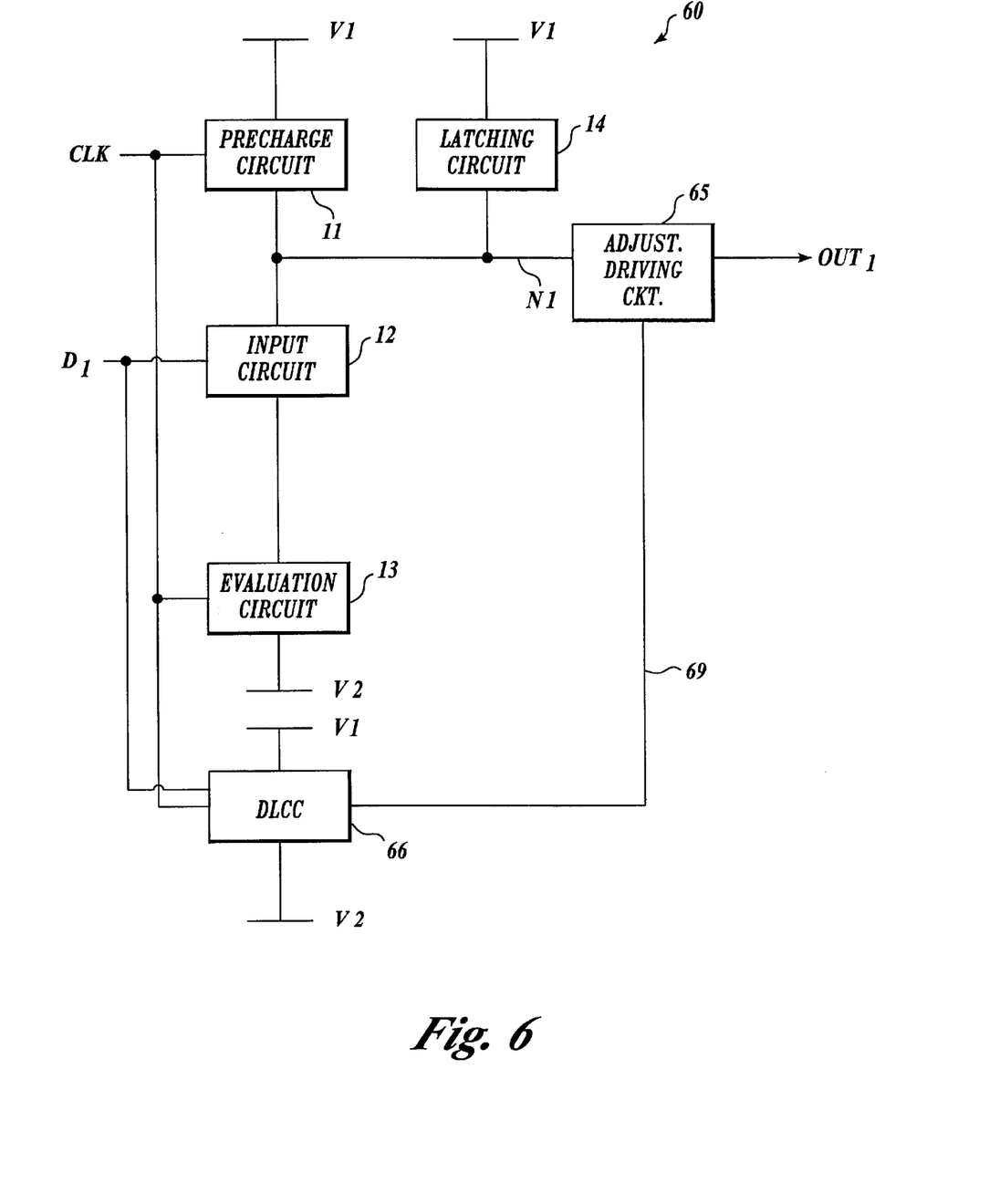
FIG. 6 is a block diagram illustrating a dynamic logic circuit with a DLCC, according to an alternative embodiment of the present invention.

FIG. 6 illustrates a dynamic logic circuit 60 with a DLCC 66, according to an alternative embodiment of the present invention. Dynamic logic circuit 60 is substantially similar to dynamic logic circuit 10 (FIG. 1), except that dynamic logic circuit 60 has an adjustable driving circuit 65 instead of driving circuit 15 and a DLCC 66 instead of DLCC 16. In one embodiment, DLCC 66 is essentially the same as DLCC 16 (FIG. 2) without adjustable latching circuit 28. Further, DLCC 66 is connected to adjustable driving circuit 65, as opposed to DLCC 16, which is connected to node N1. Adjustable driving circuit 65 is a driving circuit that has an adjustable trip point. In particular, adjustable driving circuit 65 adjusts its trip point in response to a signal generated by DLCC 66 on a line 69.

In operation, DLCC 66 models the voltage level at node N1 as in DLCC 16, and generates a signal on line 66 that appropriately adjusts the trip point of adjustable driving circuit 65. For example, if the leakage at node N1 is relatively high, then the voltage level at node N1 will undesirably change when input circuit 12 is disabled during the evaluation phase. This voltage change can cause adjustable driving circuit 54 to erroneously sense a change in logic level of the voltage at node N1. However, in accordance with the present invention, DLCC 66 can adjust the trip point of adjustable driving circuit 65 so that the voltage change caused by the leakage does not reach the trip point. In this way, dynamic logic circuit 60 can compensate for the leakage and thereby reduce the risk of erroneous operation.

Figure 6A:
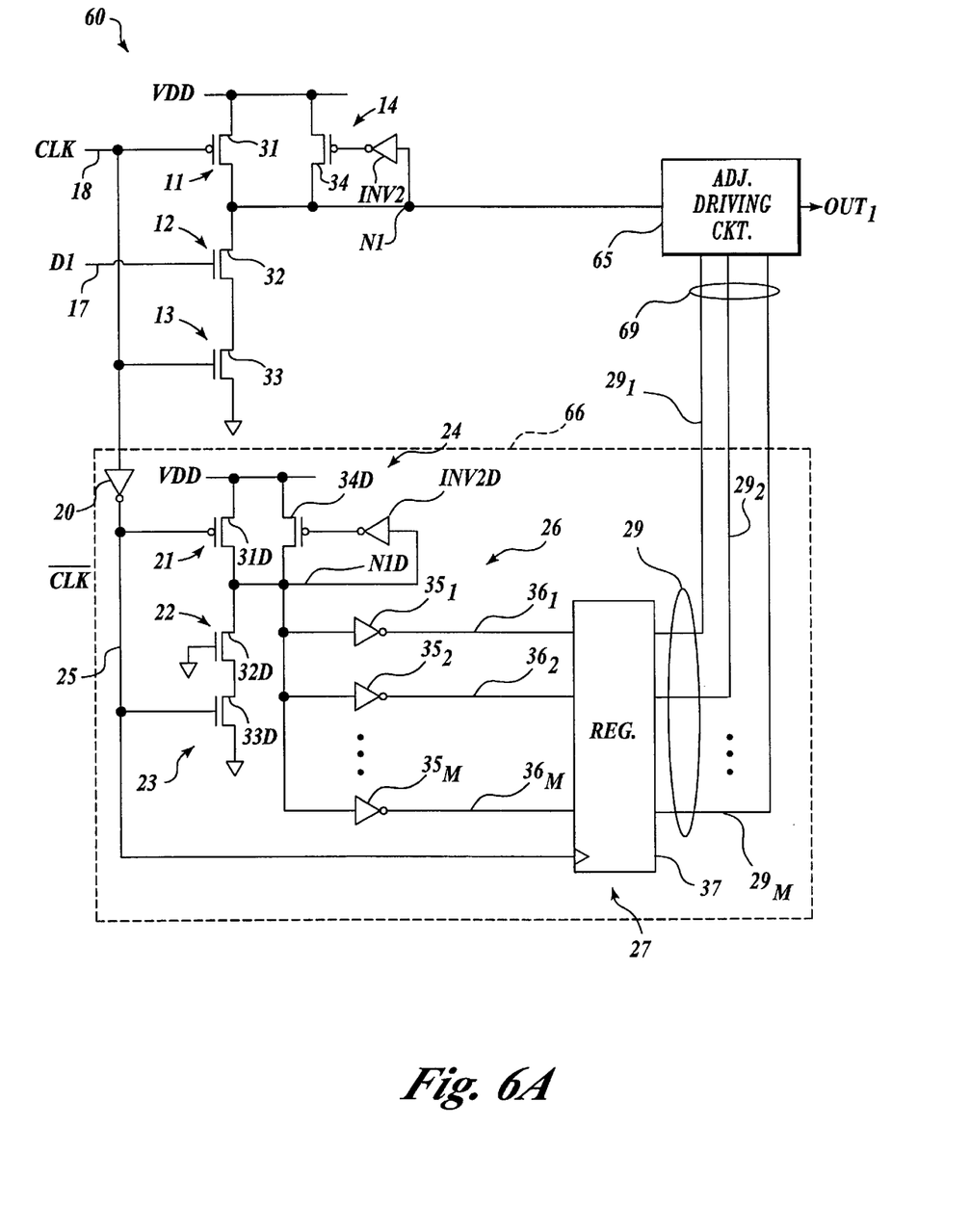
FIG. 6A is a block diagram. illustrating the DLCC of FIG. 6, according to one embodiment of the present invention.

For example, in one embodiment, dynamic logic circuit 60 is implemented as in FIG. 3, omitting adjustable latching circuit 28 and replacing inverter INV1 with adjustable driving circuit 65, with lines $29_1$–$29_M$ being used to control adjustable driving circuit 65 as shown in FIG. 6A.

Figure 7:
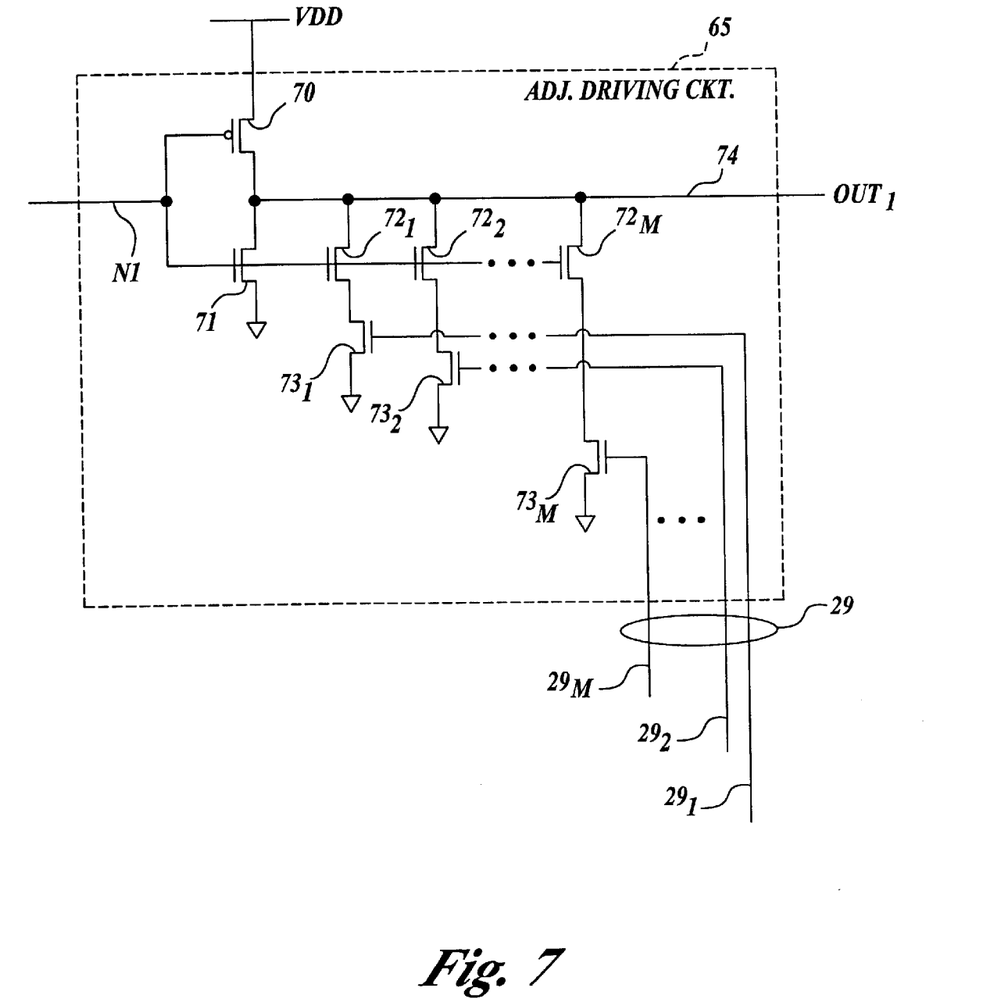
FIG. 7 is a circuit diagram illustrating an adjustable driving circuit as depicted in FIG. 6, according to one embodiment of the present invention.

One embodiment of adjustable driving circuit 65 is illustrated in FIG. 7. This embodiment of adjustable driving circuit 65 includes a P-channel transistor 70, an N-channel transistor 71, a set of N-channel transistors $72_1$–$72_M$ and a set of N-channel transistors $73_1$–$73_M$.

P-channel transistor 70 has its source, gate and drain respectively connected to the VDD bus, node N1 and an output line 74. N-channel transistor 71 has its source, gate and drain respectively connected to the ground bus, node N1 and output line 74. Thus, transistors 70 and 71 form an inverter. N-channel transistors $72_1$–$72_M$ are respectively connected to N-channel transistors $73_1$–$73_M$, to form M N-channel stacks between line 74 and the ground bus. The gates of N-channel transistors $72_1$–$72_M$ are connected to node N1. The gates of N-channel transistors $73_1$–$73_M$ are connected to register 37 (FIG. 3) via component lines $29_1$–$29_M$, respectively.

Although in the above embodiment adjustable driving circuit 65 is implemented with an inverter function, adjustable driving circuit 65 can implement other logic functions in other embodiments. For example, in light of this disclosure, those skilled in the art of dynamic circuits can design adjustable driving circuit 65 to implement a NAND, NOR and any number of more complex logic functions without undue experimentation. Similarly, input circuit 12 (FIG. 1) and driving circuit 15 (FIG. 1) can be implemented to provide various logic functions different from that shown in FIG. 3.

In operation, for each component line of component lines $29_1$–$29_M$ propagating a logic high signal, the N-channel transistor of adjustable driving circuit 65 associated with the component line is turned on, thereby "enabling" the stack. This allows each enabled stack to augment the driving capability of N-channel transistor 71, which in turn charges the trip point of adjustable driving circuit 65. In this embodiment, each enabled stack further lowers the trip point of adjustable driving circuit 65. Conversely, for each component line of component lines $29_1$–$29_M$ propagating a logic low signal, its associated N-channel transistor is turned off, thereby disabling the stack. Disabled stacks do not augment the driving capability of N-channel transistor 71. Although the sizes of N-channel transistors $72_1$–$72_M$ and $73_1$–$73_M$ can be of any suitable dimensions, in one embodiment their sizes are relatively small compared to N-channel transistor 71 so that the trip point may be adjusted in small increments.

Figure 8:
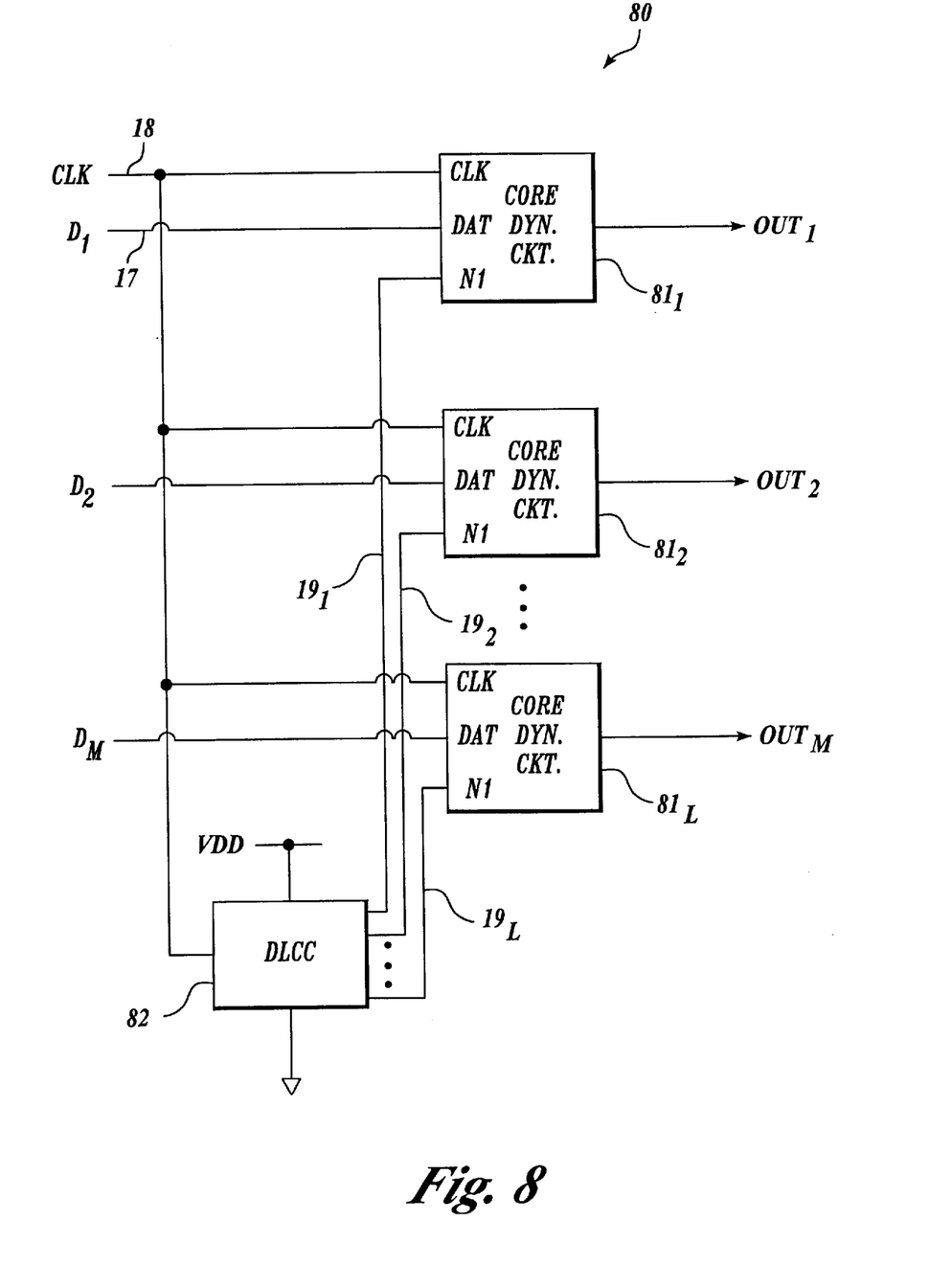
FIG. 8 is a block diagram illustrating a dynamic logic circuit with a DLLC, according to yet another alternative embodiment of the present invention.

FIG. 8 illustrates a dynamic logic circuit 80 with a DLLC configured to compensate for leakage in several core dynamic circuits, according to an alternative embodiment of the present invention. In this embodiment, dynamic logic circuit 80 includes core dynamic circuits $81_1$–$81_L$ and a DLCC 82. In one embodiment, DLCC 82 is similar to DLCC 16 (FIG. 3), and each of the core dynamic circuits $81_1$–$81_L$ includes a precharge circuit 11, input circuit 12, evaluation circuit 13, latching circuit 14, and driving circuit 15 (see FIG. 3) and operates in substantially the same manner. Further, in this embodiment, DLCC 82 has a dedicated adjustable latching circuit (not shown) for each of core dynamic circuits $81_1$–$81_L$. In one embodiment, each dedicated adjustable latching circuit is substantially identical to adjustable latching circuit 28 (FIG. 3). In another embodiment, each dedicated adjustable latching circuit can be implemented using the elements described above in conjunction with FIG. 5. In these embodiments, DLCC 82 can compensate for excessive leakage in each of core dynamic circuits $81_1$–$81_L$ by appropriately augmenting the strength of latching circuits 14 in each core dynamic circuit.

In another alternative embodiment, each of core dynamic circuits $81_1$–$81_L$ includes an adjustable driving circuit (not shown) similar to adjustable driving circuit 65 (FIGS. 6 and 7) instead of driving circuit 15 (FIG. 3). Further, DLCC 82 is implemented as in DLCC 66 (FIG. 6) instead of DLCC 16 (FIG. 3). In this embodiment, DLCC 82 can compensate for excessive leakage in each of core dynamic circuits $81_1$–$81_L$ by appropriately altering the trip point of the adjustable driving circuits in each core dynamic circuit.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A dynamic logic circuit, comprising:
   a precharge circuit coupled to a first node and coupled to receive a first clock signal configured to define precharge and evaluation phases, wherein the precharge circuit is configured to precharge the first node during the precharge phase;
   an input circuit coupled to the first node and coupled to receive a data signal;
   an evaluation circuit coupled to the input circuit and coupled to receive the first clock signal;
   a latching circuit coupled to the first node, wherein the latching circuit is configured to provide compensation for leakage at the first node;
   a driving circuit, coupled to the first node, having a trip point, wherein the driving circuit is configured to generate an output signal as a function of the trip point and a level at the first node; and
   a compensation circuit coupled to the first node, wherein the compensation circuit is configured to model a leakage at the first node and to provide additional compensation for leakage at the first node as a function of the modeled leakage.

2. The dynamic logic circuit of claim 1, wherein the compensation circuit includes:
   a dummy precharge circuit coupled to a second node and coupled to receive a second clock signal;
   a dummy input circuit coupled to the second node and coupled to receive a reference signal;
   a dummy evaluation circuit coupled to the dummy input circuit and coupled to receive the second clock signal;
   a dummy latching circuit coupled to the second node, wherein the dummy latching circuit is configured to provide compensation for leakage at the second node;
   a sense circuit coupled to the second node, wherein the sense circuit is configured to sense leakage from the second node and, as a function of the sensed leakage, generate a signal;
   a storage circuit coupled to the sense circuit, wherein the storage circuit is configured to store a value of the signal generated by the sense circuit; and
   an adjustable latching circuit coupled to the storage circuit and the first node, wherein the adjustable latching circuit is configured to provide additional compensation for leakage at the first node at a level that is dependent on the value stored in the storage circuit.

3. The dynamic logic circuit of claim 2 wherein the dummy precharge circuit, the dummy evaluation circuit, the dummy input circuit and the dummy latching circuit are designed to be matched in size and layout with the precharge circuit, the evaluation circuit, the input circuit and the latching circuit, respectively.

4. The dynamic logic circuit of claim 2 wherein the dummy precharge, dummy evaluation and dummy input circuit are scaled in size in relation to sizes of the precharge, evaluation and input circuit, respectively.

5. The dynamic logic circuit of claim 2 wherein the sense circuit is configured to sense leakage from the second node by detecting a change in voltage at the second node.

6. The dynamic logic circuit of claim 2 wherein the sense circuit includes a logic gate having a trip point that is at a level between the precharged level of the first node and a trip point of the driving circuit.

7. The dynamic logic circuit of claim 2 wherein the sense circuit includes a plurality of inverters having differing trip points between the precharged level of the first node and a trip point of the driving circuit.

8. The dynamic logic circuit of claim 2 wherein the second clock signal is a complement of the first clock signal.

9. The dynamic logic circuit of claim 2 wherein the adjustable latching circuit includes a transistor configured to provide charge to the first node as a function of the value stored in the storage circuit.

10. The dynamic logic circuit of claim 9 wherein the adjustable latching circuit further includes a logic gate coupled to the storage circuit and a control terminal of the transistor.

11. A dynamic logic circuit, comprising:
   precharge means, coupled to a first node and coupled to receive a first clock signal configured to define precharge and evaluation phases, for precharging the first node during the precharge phase;
   input means, coupled to receive a data signal, for selectively providing a portion of a current path to the first node as a function of a level of the data signal;
   evaluation means, coupled to receive the first clock signal, for providing another portion of the current path to first node during the evaluation phase;
   latching means, coupled to the first node, for providing compensation for leakage at the first node;
   driving means, coupled to the first node and having a trip point, for providing an output signal as a function of the trip point and a level at the first node; and
   compensation means, coupled to the first node, for modeling a leakage at the first node and for providing additional compensation for leakage at the first node as a function of the modeled leakage.

12. The dynamic logic circuit of claim 11, wherein the compensation circuit includes:
   dummy precharge means, coupled to receive a second clock signal configured to define dummy precharge and evaluation phases, for precharging a second node during the dummy precharge phase;
   dummy evaluation means, coupled to receive the second clock signal, for selectively providing a portion of a current path to the second node during the dummy evaluation phase;
   dummy input means for providing a high impedance in the current path to the second node;
   dummy latching means for providing compensation for leakage at the second node;
   sense means for sensing leakage from the second node and for generating a signal as a function of the sensed leakage;
   storage means storing a value of the signal generated by the sense means; and
   adjustable latching means for providing additional compensation for leakage at the first node at a level dependent on the value stored in the storage means.

13. The dynamic logic circuit of claim 12 wherein the dummy precharge means, the dummy evaluation means, the dummy input means and the dummy latching means are designed to be matched in size and layout with the precharge means, the evaluation means, the input means and the latching means, respectively.

14. The dynamic logic circuit of claim 12 wherein the sense means is configured to sense leakage from the second node by detecting a change in voltage at the second node.

15. The dynamic logic circuit of claim 12 wherein the sense means includes a logic gate having a trip point that is at a level between the precharged level of the first node and a trip point of the driving means.

16. The dynamic logic circuit of claim 12 wherein the sense means includes a plurality of inverters having differing trip points between the precharged level of the first node and a trip point of the driving means.

17. The dynamic logic circuit of claim 12 wherein the evaluation phase starts no earlier than when the dummy evaluation phase ends.

18. A dynamic logic circuit, comprising:

a precharge circuit coupled to a first node and coupled to receive a first clock signal configured to define precharge and evaluation phases, wherein the precharge circuit is configured to precharge the first node during the precharge phase;

an input circuit coupled to the first node and coupled to receive a data signal;

an evaluation circuit coupled to the input circuit and coupled to receive the first clock signal;

a latching circuit coupled to the first node, wherein the latching circuit is configured to provide compensation for leakage at the first node;

an adjustable driving circuit (ADC) coupled to the first node, wherein the ADC has an adjustable trip point and is configured to generate an output signal as a function of the trip point and a level at the first node; and a compensation circuit coupled to the ADC, wherein the compensation circuit is configured to model a leakage at the first node and to provide an output signal to the ADC to adjust the trip point of the ADC as a function of the modeled leakage.

19. The dynamic logic circuit of claim 18, wherein the compensation circuit includes:

a dummy precharge circuit coupled to a second node and coupled to receive a second clock signal;

a dummy input circuit coupled to the second node and coupled to receive a reference signal;

a dummy evaluation circuit coupled to the dummy input circuit and coupled to receive the second clock signal;

a dummy latching circuit coupled to the second node, wherein the dummy latching circuit is configured to provide compensation for leakage at the second node, the leakage;

a sense circuit coupled to the second node, wherein the sense circuit is configured to sense leakage from the second node and, as a function of the sensed leakage, generate a signal; and a storage circuit coupled to the sense circuit and the ADC, wherein the storage circuit is configured to store a value of the signal generated by the sense circuit, the storage circuit providing the output signal of the compensation circuit as a function of the stored value.

20. The dynamic logic circuit of claim 19 wherein the dummy precharge circuit, the dummy evaluation circuit, the dummy input circuit and the dummy latching circuit are designed to be matched in size and layout with the precharge circuit, the evaluation circuit, the input circuit and the latching circuit, respectively.

21. The dynamic logic circuit of claim 19 wherein the sense circuit is configured to sense leakage from the second node by detecting a change in voltage at the second node.

22. The dynamic logic circuit of claim 19 wherein the sense circuit includes a logic gate having a trip point that is at a level between the precharged level of the first node and the trip point of the ADC.

23. The dynamic logic circuit of claim 19 wherein the sense circuit includes a plurality of inverters having differing trip points between the precharged level of the first node and the trip point of the ADC.

24. A dynamic logic circuit, comprising:

precharge means, coupled to receive a first clock signal configured to define precharge and evaluation phases, for precharging the first node during the precharge phase;

input means, coupled to receive a data signal, for selectively providing a portion of a current path to the first node as a function of a level of the data signal;

evaluation means, coupled to receive the first clock signal, for providing another portion of the current path to first node during the evaluation phase;

latching means for providing compensation for leakage at the first node;

adjustable driving means, coupled to the first node and having an adjustable trip point, for providing an output signal as a function of the trip point and a level at the first node; and compensation means, coupled to the first node, for modeling a leakage at the first node and for providing additional compensation for leakage at the first node as a function of the modeled leakage.

25. The dynamic logic circuit of claim 24, wherein the compensation means comprises:

dummy precharge means, coupled to receive a second clock signal configured to define dummy precharge and evaluation phases, for precharging a second node during the dummy precharge phase;

dummy evaluation means, coupled to receive the second clock signal, for selectively providing a portion of a current path to the second node during the dummy evaluation phase;

dummy input means for providing a high impedance in the current path to the second node;

dummy latching means for providing compensation for leakage at the second node;

sense means for sensing leakage from the second node and generating a signal as a function of the sensed leakage; and storage means for storing a value of the signal generated by the sense means and providing the output signal of the compensation means to the adjustable driving means.

26. The dynamic logic circuit of claim 24 wherein the dummy precharge means, the dummy evaluation means, the dummy input means and the dummy latching means are designed to be matched in size and layout with the precharge means, the evaluation means, the input means and the latching means, respectively.

27. The dynamic logic circuit of claim 24 wherein the sense means is configured to sense leakage from the second node by detecting a change in voltage at the second node.

28. The dynamic logic circuit of claim 24 wherein the sense means includes a logic gate having a trip point that is at a level between the precharged level of the first node and a maximum trip point of the adjustable driving means.

29. The dynamic logic circuit of claim 24 wherein the sense means includes a plurality of inverters having differing trip points between the precharged level of the first node and a maximum trip point of the adjustable driving means.

30. The dynamic logic circuit of claim 24 wherein the evaluation phase starts no earlier than when the dummy evaluation phase ends.

* * * * *

UNITED STATES PATENT AND TRADEMARK OFFICE
CERTIFICATE OF CORRECTION

PATENT NO. : 6,396,305 B1
DATED : May 28, 2002
INVENTOR(S) : Carlson

It is certified that error appears in the above-identified patent and that said Letters Patent is hereby corrected as shown below:

Column 3,
Line 33, delete "OUT," and insert -- $OUT_1$ --.
Line 35, delete "OUT," and insert -- $OUT_1$ --.
Line 50, delete "OUT," and insert -- $OUT_1$ --.

Column 5,
Line 17, delete "D," and insert -- $D_1$ --.
Line 40, delete "1800º" and insert -- 180º --.
Line 47, delete "D," and insert -- $D_1$ --.
Line 59, delete "edgetriggered" and insert -- edge-triggered --.

Column 6,
Line 59, delete "28," and insert -- $28_1$ --.
Line 59, delete "38," and insert -- $38_1$ --.

Column 8,
Line 47, delete "41," and insert -- $41_1$ --.
Line 47, delete "42," and insert -- $42_1$ ---.
Line 47, delete "43," and insert -- $43_1$ --.

Signed and Sealed this

Eighth Day of October, 2002

Attest:

Attesting Officer

JAMES E. ROGAN
*Director of the United States Patent and Trademark Office*